US007518290B2

(12) United States Patent
Frey

(10) Patent No.: US 7,518,290 B2
(45) Date of Patent: Apr. 14, 2009

(54) TRANSDUCER ARRAY WITH NON-UNIFORM KERFS

(75) Inventor: Gregg W. Frey, Issaquah, WA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 22 days.

(21) Appl. No.: 11/820,606

(22) Filed: Jun. 19, 2007

(65) Prior Publication Data

US 2008/0315723 A1 Dec. 25, 2008

(51) Int. Cl.
*H01L 41/08* (2006.01)

(52) U.S. Cl. ........................................................ 310/334

(58) Field of Classification Search ................. 310/322, 310/334; 29/25.35
See application file for complete search history.

(56) References Cited

U.S. PATENT DOCUMENTS

| | | | |
|---|---|---|---|
| 5,099,459 A | 3/1992 | Smith | |
| 5,438,554 A * | 8/1995 | Seyed-Bolorforosh et al. | 367/140 |
| 5,920,523 A * | 7/1999 | Hanafy et al. | 367/140 |
| 6,043,589 A * | 3/2000 | Hanafy | 310/335 |
| 6,225,728 B1 | 5/2001 | Gururaja | |
| 6,422,227 B1 * | 7/2002 | Kobayashi et al. | 125/13.01 |
| 6,798,717 B2 | 9/2004 | Wiener-Avnear et al. | |
| 6,971,148 B2 * | 12/2005 | Mohr et al. | 29/25.35 |

* cited by examiner

*Primary Examiner*—Thomas M Dougherty

(57) ABSTRACT

A multi-dimensional transducer array is provided. The multi-dimensional transducer array includes a plurality of elements. First and second kerfs acoustically separate the elements. A first width of the first kerf is larger than a second width of the second kerf.

18 Claims, 3 Drawing Sheets

TRANSDUCER ARRAY WITH NON-UNIFORM KERFS

BACKGROUND

The present invention relates to transducer arrays. In particular, a multi-dimensional transducer array with non-uniform kerf widths is provided.

Transducers are used to convert between electrical charge and acoustic energy. Medical imaging techniques utilize transducers to generate images of internal organs and physiology of humans as well as animals. For example, the acoustic energy is transmitted into a patient and echoes are received in response to the transmission. Electrical signals generated in response to the acoustic echoes are used to generate an image. Ultrasound machines may use phased transducer arrays to generate and receive these sound waves to create two, three, or four dimensional images, such as an image of a fetus or a beating heart.

In manufacturing transducer arrays, a plurality of elements are typically formed and aligned in a one dimensional or multi-dimensional arrangement. Most transducer arrays have acoustic elements that rely on dicing of a piezoelectric ceramic layer to obtain a favorable aspect ratio for "clean" resonance modes, i.e., minimizing lateral or other unwanted modes. The elements are formed by dicing kerfs into transducer material where the kerf widths typically are the same between the respective elements. Dicing may be either from the front side of the transducer material or from the back side of the transducer material.

BRIEF SUMMARY

By way of introduction, the preferred embodiments described below include elements, arrays and methods of manufacturing transducer arrays. A plurality of major and minor elements are formed by dicing into transducer material. The major and minor elements are arranged to form an array with non-uniform kerfs.

In a first aspect, a multi-dimensional transducer array is provided. The multi-dimensional transducer array includes a plurality of elements. First and second kerfs acoustically separate the elements. A first width of the first kerf is larger than a second width of the second kerf.

In a second aspect, a multi-dimensional ultrasound transducer array is provided. A plurality of major elements are acoustically and electrically separated from each other by a plurality of major kerfs. The plurality of major elements is in a multi-dimensional distribution. A plurality of minor elements are formed within each of the plurality of major elements by a plurality of minor kerfs. Widths of the plurality of major kerfs are larger than widths of the plurality of minor kerfs.

In a third aspect, a method is provided for manufacturing a multi-dimensional transducer array. A layer of transducer material is diced into for a first kerf width. The layer of transducer material is diced into for a second kerf width. The second kerf width is different than the first kerf width.

The present invention is defined by the following claims, and nothing in this section should be taken as a limitation on those claims. Further aspects and advantages of the invention are discussed below in conjunction with the preferred embodiments.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

A multi-dimensional transducer array has a plurality of discrete piezoelectric elements. The array is formed by dicing into at least one layer of transducer material, creating kerfs with different widths. In one embodiment, a larger or wider kerf width is used to separate major elements, and a smaller or thinner kerf width is used to separate minor elements in a major element. The major element is composed of several minor elements, electrically connected but acoustically separated to improve the impulse response. In other embodiments, other combinations of wider and narrower kerfs are used. By using a wider major kerf than the minor kerf, a more independent element response is achieved.

Figure 1:
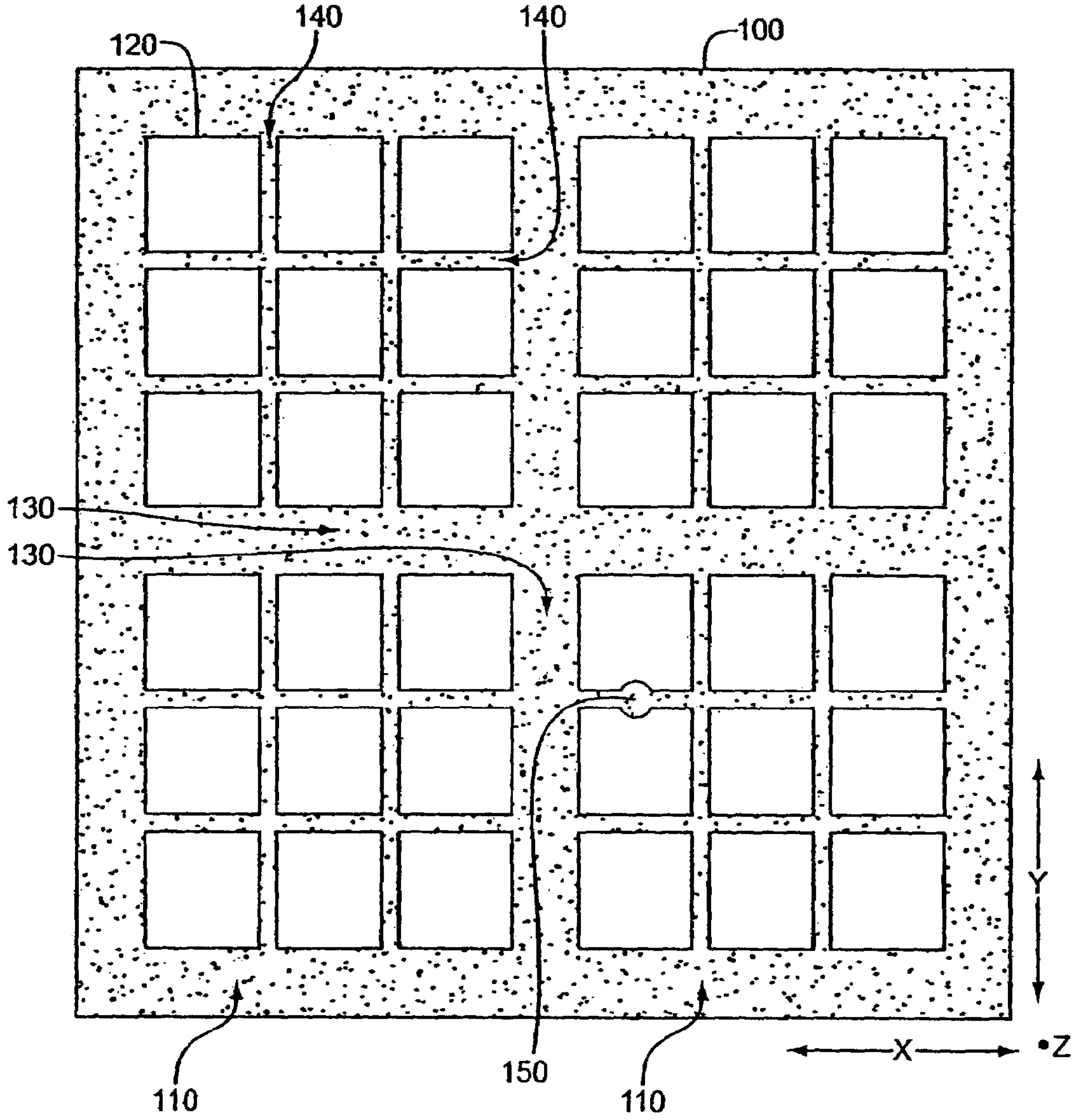
FIG. 1 is a perspective view of one embodiment of a multi-dimensional transducer array.
Figure 2:
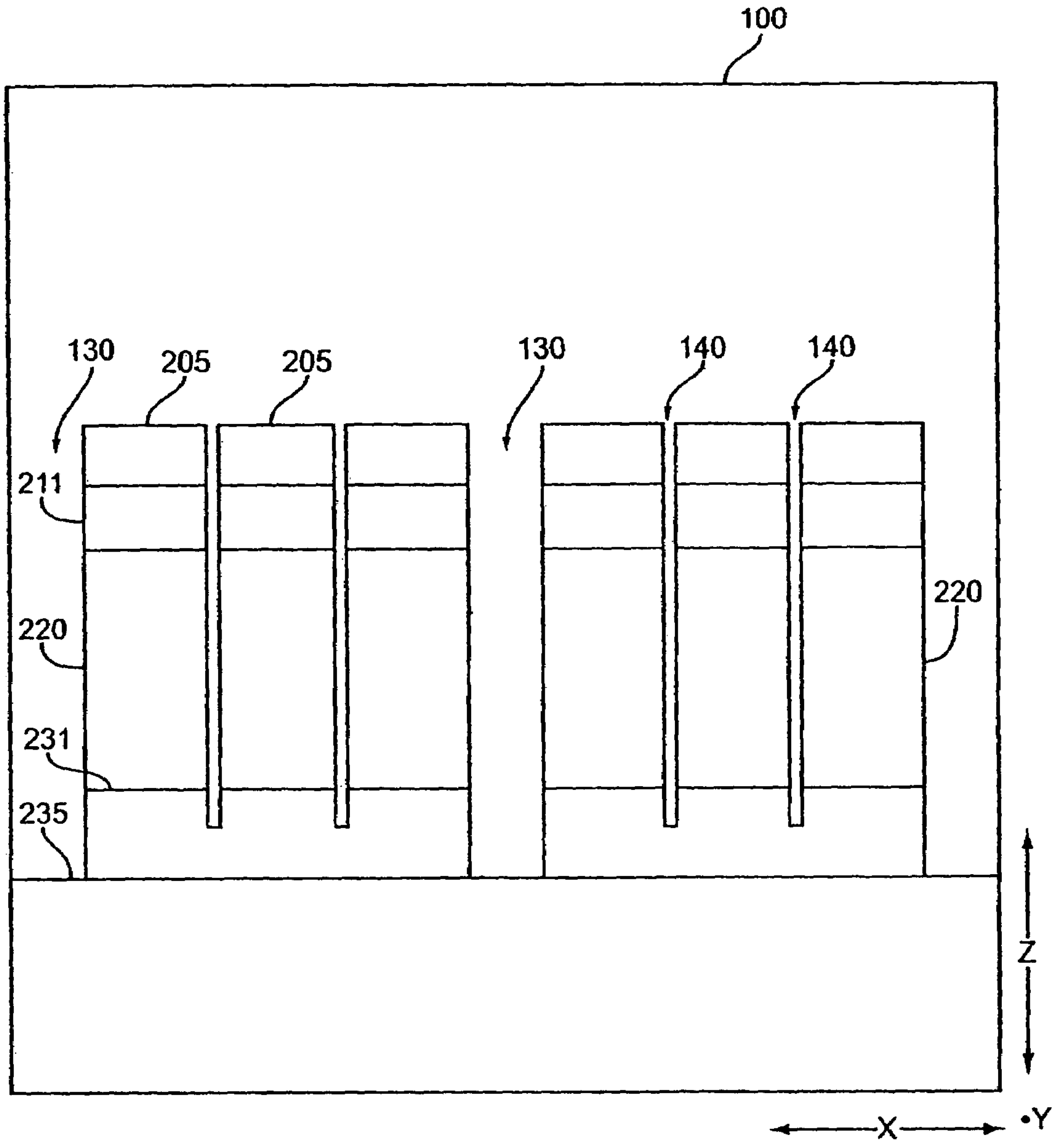
FIG. 2 is a cross-section view of one embodiment of the multi-dimensional transducer array of FIG. 1.
Figure 3:
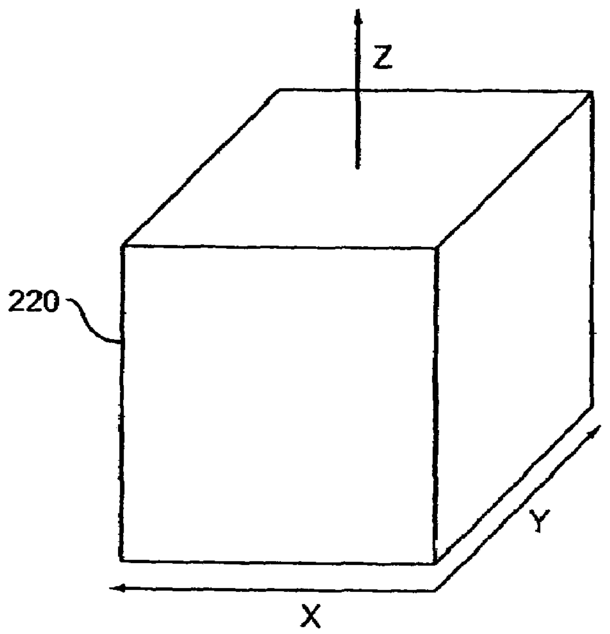
FIG. 3 is an isometric view of a transducer material of the multi-dimensional transducer array of FIG. 1.

FIG. 1 shows a perspective view of one embodiment of a multi-dimensional transducer array. X, Y and Z dimensions are shown in FIGS. 1-3. The Z dimension corresponds to a range dimension in ultrasound or phased array imaging. The Y and X dimensions correspond to elevation and azimuth dimensions, respectively or vice versa. The array is within a system 100. The system 100 is an ultrasound probe, such as a fetal cardiac probe, intraoperative probe, intracavity probe, external probe, catheter, an ultrasound system, or any other known or future medical imaging system. Alternatively, the system 100 may be a radar system, sonar system, any beam forming array structure, or any other present or future system that utilizes transducer arrays.

In the system 100, four major elements 110 are shown, but fewer (e.g., 2), more (e.g., hundreds) or any number of major elements may be used. For example, the system 100 has about 2,304 major elements. Any sub-set of the available elements may be used for a given aperture. The selection of an aperture size involves the tradeoff between lateral resolution and field of view. For example, a larger aperture allows for more lateral resolution, but a narrower field of view when the number of active elements are kept the same. A square shaped, circular shaped, or any other geometrical shaped aperture may be used.

The array is spaced along a square grid pattern. Alternatively, the multi-dimensional array is spaced along a rectangular, hexagonal, triangular or other now known or later developed grid pattern. For square or rectangular grid patterns, the multi-dimensional array includes M×N major elements 110, such as where M extends along the X dimension and N extends along the Y dimension.

The major elements 110 are acoustically separated from each other by at least one major kerf 130. The major elements 110 may be interconnected by a bridge or other piezoelectric structure. The major elements are also electrically separated from each other, but may be electrically connected.

Within one major element 110, minor elements 120 are formed and acoustically separated from each other by at least one minor kerf 140. The minor kerfs 140 may also electrically separate the minor elements 120. In other embodiments, the minor elements 120 are electrically connected together. For example, the minor elements 120 within a same major element 110 are connected to the same electrodes or beamformer channel. In one embodiment, the minor kerfs 140 extend less than a full depth of the element to avoid electrical isolation of electrodes on a bottom of the elements 110, 120.

One minor kerf 140 extends along one side of the minor element 120. In one embodiment, the minor kerf 140 extends at least from one azimuthal edge to another azimuthal edge of one of at least two major elements 110. One minor kerf 140 may also be a cut in the elevation direction or any other three-dimensional direction.

The width of one major kerf 130 is different than the width of one minor kerf 140. For example, the width of one major kerf 130 is larger than the width of one minor kerf 140. Alternatively, the widths of a plurality or all of the major kerfs 130 are larger than the widths of a plurality or all of the minor kerfs 140. In one embodiment, the minor kerfs 140 are about half the width of the major kerfs 130.

The minor elements 120 are aligned in a 3×3 arrangement. Alternatively, any number of minor elements 120 may be formed in any number of geometric arrangements. For example, a one-dimensional array is provided with different kerf widths between elements along the array.

A via 150 within one of the major elements 110 is intersected by one minor kerf 140. Alternatively, all of the major elements may have at least one via or a plurality of vias. The vias are placed where to avoid intersection with minor or major kerfs 140 and 130, respectively, partially intersected by the kerfs 140, 130, and/or completely removed by the kerfs 140, 130. Vias can also be located in centers of the minor elements 120, allowing for diagonal kerfs to be made. In one embodiment, the vias 150 are positioned to be intersected by only minor kerfs 140. The width of the via 150 leaves a portion of the via 150 on each side after forming the minor kerf 140. While only one via 150 is shown between two minor elements 120, vias 150 are provided between all the minor elements 120 at the sides of the minor elements 120 that are intersected by the minor kerfs 140 in the X direction. The via 150 allows for electrical interconnection between different layers associated with a transducer element.

FIG. 2 shows a cross-section view of one embodiment of the multi-dimensional transducer array of FIG. 1. Different layers may be stacked and bonded with the transducer material. An electrode layer 205, one or more matching layers 211, a transducer material layer 220, a electrode layer 231, and a backing block 235 are adjacently formed in a stack. Additional, different, or fewer components may be used. The layers may be stacked in a different order, such as providing the top electrode 205 between the matching layer 211 and the transducer material 220. For example, the position of the bottom electrode layer 231 and the top electrode layer 205 may be switched.

The different layers of the array are bonded together via sintering, lamination, asperity contact, or any other chemical or mechanical structure or technique used to hold the layers together.

In one embodiment, both the top and bottom electrode layers 205, 231 are patterned, such as providing for a transmit array using the layer 205 with the layer 231 grounded and for a receive array using the layer 231 with the layer 205 grounded. Providing electrodes on different sides of the transducer material 220 for transmit and receive operation may eliminate transmit and receive switches in the associated application specific integrated circuits, ("ASICs").

In alternative embodiments, one of the electrode layers 205, 231 is a ground layer and may be undiced or patterned. A patterned flexible or flex circuit may be arranged between the transducer material and the backing block. Any other arrangement of transceiver circuitry may be used.

The electrode layers 205, 231 are conductors on KAPTON™, deposited electrodes, or any other material.

The matching layer 211 is a single layer or multiple matching layers. In one embodiment, the matching layer 211 is the KAPTON™ supporting the conductors of the top electrode 205 and/or any other suitable material, such as polymer, inorganic and/or organic conductive materials as well as filled or unfilled conductive composites. The backing block 235 material is any type of acoustic attenuating material or a mix of different materials. The backing block 235 is used to attenuate, absorb or reduce reflections of acoustic energy. Alternatively, the backing block 235 includes alternating layers of acoustic attenuating material and electrical trace supporting material. Also, the backing block 235 may include an anechoic surface, such as a Rayleigh dump.

The different layers in a stack are electrically isolated. The vias 150 electrically connect the top electrodes 205 to flex circuits or other connections for beamforming and/or grounding. TAB like jumpers, wire bonding, traces, and/or any other electrical interconnection may be provided.

In one embodiment, multiple layers of transducer material 220 and corresponding electrodes form each element 120. The vias 150 electrically interconnect every other electrode layer.

FIG. 3 is an isometric view of a transducer material, such as the transducer material 220, of the multi-dimensional transducer array of FIG. 1. The transducer material 220 is piezoelectric ("PZT"), ceramic, silicon, semiconductor and/or membranes, but other materials or structures may be used to convert between acoustical and electrical energies. Alternatively, the transducer material 220 is a multi-layered transducer material having at least two layers of transducer material. Multiple layers of transducer material may be bonded together via sintering, lamination, asperity contact, or any other chemical or mechanical structure or technique used to hold the layers together. Also, the multiple layers of transducer material are electrically interconnected by vias, such as the via 150, electrode arrangements, such as signal and ground electrodes with or without discontinuities on each layer of transducer material, traces, TAB like jumpers, wire bonding, and/or any other electrical interconnection.

Alternatively, the transducer material 220 is a silicon substrate with one or more flexible membranes (e.g., tens or hundreds) formed within or on the silicon substrate. The flexible membrane has an electrode on at least one surface for transducing between energies using a capacitive effect, such as provided in capacitive membrane ultra sound transducers. The membrane is formed with silicon or other materials deposited or formed on the silicon substrate.

Referring to FIG. 2, the major kerfs 130 cross through the top electrode layer 205, the matching layer 211, the minor element 120, and the bottom electrode layer 235 acoustically and electrically separating the major elements 110 from each other. The minor kerfs 140 cross through the top electrode layer 205, the matching layer 211, the minor element 120, and part of the bottom electrode layer 235 acoustically separating the minor elements 120 from each other. The minor elements 120 are electrically connected by the bottom electrode layer 235 and are operable as a single element. Alternatively, a minor kerf 140 completely crosses through the bottom electrode layer 235, but the minor elements 120 are electrically connected through any type of electrical interconnection.

Alternatively, the minor elements 120 may be electrically separated from each other to act independently from one another. Also, a plurality of major elements 110 may be electrically connected together. Any combination of electrically separated minor elements, electrically connected minor elements, electrically separated major elements, and/or electrically connected major elements may be used. Additionally, any degree of depth may be utilized when creating major kerfs 130 or minor kerfs 140. For example, the major kerf 130 and/or minor kerf 140 extends through the backing block 235. Also, FIG. 2 shows stacks diced from the front side, but the stacks may be diced from the backing side as well. For example, the kerfs extend through the backing block 235 while matching layers remain continuous. Additionally, any variety of stepped kerf widths may be utilized. The matching layer 211 and/or top electrode layer 205 may be formed or added after dicing.

The widths of the major kerfs 130 are larger or wider than the widths of the minor kerfs 140. The width of one or each of the minor kerfs 140 is at least about 20 microns, where a micron is a micrometer, and less than about 100 microns, and the width of one or each of the major kerfs 130 is at least about 100 microns. For example, the width of one major kerf 130 is about 150 microns and the width of one minor kerf 140 is about 50 microns, where the pitch of one of the major elements 110 is about 800 microns. Alternatively, the width of one or each of the major kerfs 130 is less than about 100 microns, such as about 70 microns. Having larger or wider major kerfs 130 allows for a more independent element, i.e., less cross talk between neighbors. Also, increasing the kerf widths for the major elements 110 allows for a better steering ability, such as off-axis steering. For example, a 2D large pitch array using same kerf widths, such as 50 microns, for minor and major elements achieves a scanning sector of about 10 degrees. However, using major kerf widths 130 of about 150 microns and minor kerf widths 140 of about 50 microns achieves a scanning sector of about at least 16 degrees, which provides for better images, such as more complete fetal heart images. Also, having smaller or thinner minor kerf widths 140 maintains acoustic mass and a good efficiency as well as allows for an improved aspect ratio, such as about 0.30. Nonetheless, any width may be used for either a major kerf 130 or minor kerf 140 as long as at least one major kerf 130 has a different width than at least one minor kerf 140.

Alternatively, the widths of different major kerfs 130 and the widths of different minor kerfs 140 may vary. For example, one of the major kerfs 130 is wider or thinner than the other major kerfs 130, and one of the minor kerfs 140 is wider or thinner than the other minor kerfs 140. Any combination of varying minor or major kerf widths discussed above may be used.

The spacing of the major elements 110 and minor elements 120, i.e., the widths of the major kerfs 130 and the minor kerfs 140, is related to the operating frequency of the transducer array. As the operating frequency increases, the respective widths of the major and minor kerfs are created with smaller or thinner widths. For example, a 2.75*C megahertz ("MHz") transducer array has a plurality of major kerfs 130 and a plurality of minor kerfs 140. C is a constant coefficient representing a multiplication factor of the operating frequency. If C=1, then the array is designed with the major kerfs 130 with widths at about 150 microns and the minor kerfs 140 with widths at about 50 microns. If C is about 1.82, in which the operating frequency is about 5 MHz, the array is designed with the major kerfs 130 with widths at about 75 microns and the minor kerfs 140 with widths at about 25 microns.

Figure 4:
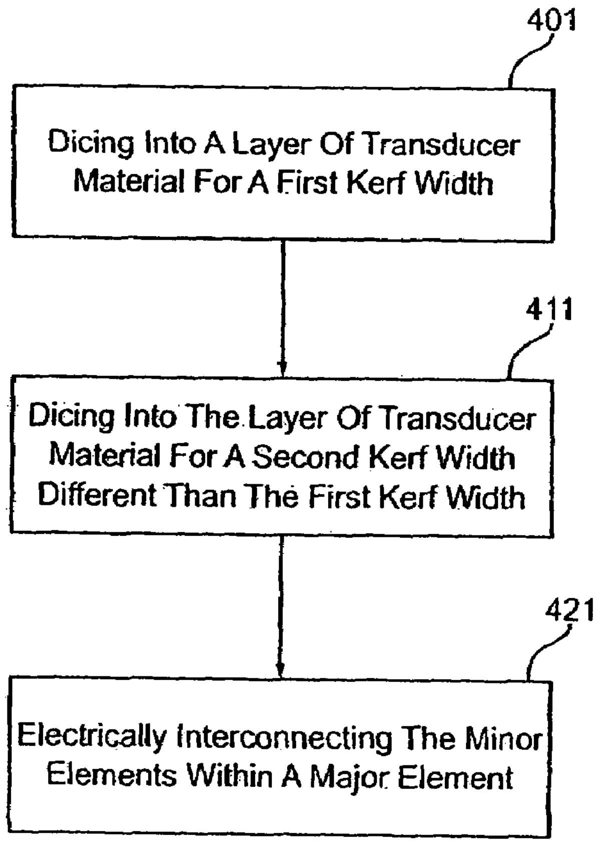
FIG. 4 is a flowchart of one embodiment of a method of manufacturing a multi-dimensional transducer array.

FIG. 4 shows a flowchart of one embodiment of a method of manufacturing a multi-dimensional transducer array. A layer of transducer material is provided. In act 401, the layer of transducer material is diced for a first kerf width. In act 411, the layer of transducer material is diced for a second kerf width that is different than the first kerf width. For example, the second kerf width is smaller or thinner than the first kerf width. The width sizes may be any of the sizes mentioned above, such as about 150 microns for the first kerf width and about 50 microns for the second kerf width. Alternatively, multiple layers of transducer material as well as any number of different layers, such as matching layers, flex circuit layers, signal traces, electrodes, a lens and/or a backing block, are diced into at various depths for the first kerf width and the second kerf width.

Dicing for the first kerf width includes forming the major elements 110 and dicing for the second kerf width includes forming the minor elements 120 within the major elements 110. The minor elements 110 are formed in a 3×3 arrangement. Alternatively, dicing creates the major and minor elements 110 and 120, respectively, in any variety of grid patterns and any number of M×N elements discussed above. Also, step dicing cuts may be used to form either major or minor elements 110 and 120, respectively. For example, when forming a minor element 110, a partial dicing cut may be made to a certain depth, and then a deeper cut may be made next to the partial cut creating a stepped kerf. Alternatively, a partial cut may be made to a certain width, and then a deeper cut may be made in the same location to a smaller or thinner width to create a stepped kerf.

A first blade with the first width is used for forming the first kerf, such as a major kerf 130, and a second blade with the second width is used for forming the second kerf, such as a minor kerf 140. The first and second blades are metal blades with diamond edges and/or any other type of known or future blade that is or will be used for cutting transducer material and associated materials. Alternatively, a same blade is used for dicing the first and second kerfs. For example, a blade with the second width is used to form the minor kerfs 140, and the same blade forms the larger or wider first kerf width by using multiple cuts. Also, when forming stepped kerfs, a single blade or a plurality of blades may be used. For example, a single dice and/or a series of dices may be implemented using one blade or a combination of blades to create at least one stepped kerf. When choosing a blade for dicing, a blade length-to-width ratio may be taken into consideration, especially for thinner blades. As the widths of blades decrease for creating thinner and thinner minor kerfs, the blades may experience breaks or fractures. Therefore, length-to-width ratios of blades may correspond to a limit of how thin a width for a minor kerf, such as a minor kerf 140, can be formed.

Any number of other techniques for dicing may be used. For example, high pressure liquid or vapor, lasers, focused heat, and/or any other type of known or future cutting device or process may be used. Any combination of dicing techniques discussed above may be utilized for forming the major and minor elements 110 and 120, respectively, of the multi-dimensional transducer array.

In act 421, the minor elements 120 within one of the major elements 110 are electrically interconnected. The electrical interconnection is accomplished using flex circuits, such as a bi-flex, signal traces, TAB like jumpers, electrodes, and/or any other type of electrical interconnection. The electrical interconnection allows the minor elements 120 to operate as a single major element 110 that is operable for connection with a beamformer channel. The minor elements 120 may be electrically interconnected by an electrode layer rather than actively interconnecting. Alternatively, any combination of electrical interconnections between the major and minor elements 110 and 120, respectively, is used.

Any of the features or structural arrangements in regards to the multi-dimensional transducer array discussed above may be arranged into method steps for manufacturing the array. For example any variety of methods to stack and/or bond the different layers associated with the transducer array discussed above may be utilized in manufacturing. Also, the features and methods discussed above may be mixed and matched to create a variety of transducer arrays.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

I claim:

1. A transducer array comprising:

a plurality of major elements arranged to define a multi-dimensional array, wherein each of the plurality of major elements comprises a plurality of minor elements; and first and second kerfs acoustically separating the plurality of major elements and the plurality of minor elements, wherein a first width of the first kerf is larger than a second width of the second kerf;

wherein each of the plurality of major elements disposed in the multi-dimensional array is separated in first and second directions from the remaining plurality of major elements disposed in the multi-dimensional array by the first kerf;

wherein each of the plurality of minor elements within each of the plurality of major elements is separated by the second kerf.

2. The array of claim 1, wherein the elements each comprise at least two layers of transducer material.

3. The array of claim 2, wherein the transducer material is a piezoelectric ceramic material.

4. The array of claim 1, wherein the second kerf comprises a cut extending from a first azimuthal edge to a second azimuthal edge of one of the at least two of the plurality of major elements.

5. The array of claim 1, wherein the first width of the first kerf is about 150 microns and the second width of the second kerf is about 50 microns.

6. The array of claim 5, wherein the multi-dimensional array is a M×N multi-dimensional array, wherein a spacing of the plurality of major elements corresponds to an operating frequency of about 2.75*C MHz, C being a constant coefficient representing a multiplication factor of the operating frequency.

7. A multi-dimensional, ultrasound transducer array comprising:

a plurality of major elements acoustically and electrically separated from each other by a plurality of major kerfs, wherein the plurality of major elements is in a multi-dimensional distribution; and a plurality of minor elements formed within each of the plurality of major elements by a plurality of minor kerfs, wherein widths of the plurality of major kerfs are larger than widths of the plurality of minor kerfs, and wherein the width of one of the plurality of minor kerfs is different than the width of another one of the plurality of minor kerfs.

8. A multi-dimensional, ultrasound transducer array comprising:

a plurality of major elements acoustically and electrically separated from each other by a plurality of major kerfs, wherein the plurality of major elements is in a multi-dimensional distribution; and a plurality of minor elements formed within each of the plurality of major elements by a plurality of minor kerfs, wherein widths of the plurality of major kerfs are larger than widths of the plurality of minor kerfs.

9. The array of claim 8, wherein one of the plurality of major elements includes a via, each of the minor elements within a major element being electrically connected and operable as a single element.

10. The array of claim 8, wherein the plurality of major elements is within an ultrasound transducer probe.

11. The array of claim 8, wherein the width of each of the plurality of minor kerfs is at least about 20 microns and less than 100 microns and wherein the width of the major kerfs is at least about 100 microns.

12. A multi-dimensional, ultrasound transducer array comprising:

a plurality of major elements acoustically and electrically separated from each other by a plurality of major kerfs, wherein the plurality of major elements is in a multi-dimensional distribution, and wherein the width of one of the plurality of major kerfs is different than the width of another one of the plurality of major kerfs; and a plurality of minor elements formed within each of the plurality of major elements by a plurality of minor kerfs, wherein widths of the plurality of major kerfs are larger than widths of the plurality of minor kerfs.

13. A method of manufacturing a transducer array, the method comprising:

dicing into a layer of transducer material for a first kerf width; and dicing into the layer of transducer material for a second kerf width different than the first kerf width;

wherein dicing for the first kerf width comprises forming major elements in a multi-dimensional array and dicing for the second kerf width comprises forming minor elements within the major elements, and wherein the first kerf width larger than the second kerf width.

14. The method of claim 13, wherein dicing for the first and second kerf widths comprises using a first blade with the first kerf width, and using a second blade with the second kerf width, the second kerf width smaller than the first kerf width.

15. The method of claim 13, wherein both dicing acts comprise using a same blade, and dicing using multiple cuts to form a larger first kerf width than the second kerf width.

16. The method of claim 13, wherein dicing for the second kerf width comprises forming the minor elements in a 3×3 arrangement within the major elements.

17. The method of claim 13, further comprising:

electrically interconnecting the minor elements within a major element, the major element operable for connection with a beamformer channel.

18. The method of claim 13, wherein dicing into the layer of transducer material for one of the first kerf width and the second kerf width comprises forming a stepped kerf.

* * * * *